(12) United States Patent
Krishnamurthy et al.

(10) Patent No.: US 6,351,150 B1
(45) Date of Patent: Feb. 26, 2002

(54) LOW SWITCHING ACTIVITY DYNAMIC DRIVER FOR HIGH PERFORMANCE INTERCONNECTS

(75) Inventors: Ram K. Krishnamurthy, Beaverton; Mark A. Anders, Hillsboro; Atila Alvandpour, Portland, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/658,793

(22) Filed: Sep. 11, 2000

(51) Int. Cl.[7] .......................................... H03K 19/096
(52) U.S. Cl. ............................ 326/98; 326/93; 326/95; 327/208; 327/407; 327/408
(58) Field of Search ............... 326/93–98; 327/208–212, 327/214, 215, 224, 225

(56) References Cited

U.S. PATENT DOCUMENTS 6,005,417 A * 12/1999 Mehta et al. ................. 326/98
6,028,814 A * 2/2000 Lim ....................... 365/230.06
6,140,843 A * 10/2000 Howard ........................ 326/93

* cited by examiner

Primary Examiner—Michael Tokar
Assistant Examiner—Vibol Tan
(74) Attorney, Agent, or Firm—Schwegman, Lundberg, Woessner & Kluth, P.A.

(57) ABSTRACT

A high performance interconnect that utilizes dynamic driver technology is capable of reduced power operation during periods of low data switching activity. Circuitry is provided that limits the performance of an evaluation operation in the dynamic driver circuitry to clock cycles during which a present input bit of the interconnect differs from a previous input bit. Thus, the evaluation operation and subsequent precharge of the driver output is performed sparingly during periods of low data switching activity. An output circuit is also provided for decoding the data stream flowing through the interconnect at the receiver end thereof. Using the principles of the present invention, it is possible to achieve the performance advantages of dynamic drivers with the switching activity of interconnects that use static CMOS technology.

21 Claims, 3 Drawing Sheets

| IN | INPREV | EX OR OUTPUT |
|---|---|---|
| 0 | 0 | 0 (STAY PRECHARGED) |
| 0 | 1 | 1 (EVALUATE) |
| 1 | 0 | 1 (EVALUATE) |
| 1 | 1 | 0 (STAY PRECHARGED) |

| IN | INPREV | EX OR OUTPUT |
|---|---|---|
| 0 | 0 | 0 (STAY PRECHARGED) |
| 0 | 1 | 1 (EVALUATE) |
| 1 | 0 | 1 (EVALUATE) |
| 1 | 1 | 0 (STAY PRECHARGED) |

LOW SWITCHING ACTIVITY DYNAMIC DRIVER FOR HIGH PERFORMANCE INTERCONNECTS

FIELD OF THE INVENTION

The invention relates generally to interconnects for use in digital processing devices and, more particularly, to interconnects that utilize dynamic driver techniques.

BACKGROUND OF THE INVENTION

The integration density of circuit elements within integrated circuits is continuously increasing. The resulting reduction in size of circuit elements and the accompanying on-die heat dissipation problems has created interest in developing low power, low voltage circuit technologies that maintain or improve past circuit performance. One performance bottleneck that has arisen with increased integration density relates to the point to point interconnects within an integrated circuit. One of the primary reasons for this bottleneck is because the capacitance per unit length of such interconnects, which is dominated by sidewall fringing and coupling, increases hyperbolically with lateral dimension scaling.

To overcome problems related to increased interconnect capacitance due to scaling, a change to dynamic interconnect driver technologies has been proposed. In a dynamic driver circuit, the driver output node is only able to transition in one direction (i.e., monotonically) during normal driver operation, thus reducing the interconnect's worst-case coupling capacitance by half. This is normally implemented by precharging the driver output node to the supply voltage before considering a present driver input data bit and then either discharging or maintaining the charge on the output node based on the value of the driver input bit. Thus, the output potential of the driver either remains the same or moves in a single direction after the current input bit is considered. In an alternative approach, the driver output node can be discharged initially and then be charged or remain discharged based on the value of the current input bit.

The reduction in capacitance achieved by utilizing dynamic driver techniques can provide a significant improvement in, for example, driver performance, interconnect RC delay, peak current, and/or switched capacitance per transition. However, the need to repeatedly precharge and evaluate the dynamic driver can cause substantial dynamic power loss during periods of low data switching activity on the interconnect. Periods of low data switching activity are common on data busses and other transmission media within digital data processing devices. Thus, the use of dynamic driver techniques within such busses can significantly increase power consumption (and the heat dissipation problems associated therewith) within these processing devices.

Therefore, there is a need for a method and apparatus that allows the benefits of dynamic driver circuits to be realized within an interconnect without the high power loss associated with low data switching activity.

DETAILED DESCRIPTION

The present invention relates to a techniques for implementing a dynamic driver-based interconnect within a digital processing device. The techniques allow the benefits of dynamic drivers to be realized within interconnects during periods of low switching activity without the high power loss that is typical of such an arrangement. A logic circuit is added to the input of a dynamic driver that causes the driver to evaluate only when a present input data bit differs from a previously received input data bit. Thus, the output node of the driver will discharge (and thus need to be recharged) only when a change in the input data bit occurs. Because the discharge and subsequent recharge of the output node of the driver is responsible for most of the dynamic power loss within the driver, the overall power consumption of the interconnect can be dramatically reduced during periods of low switching activity using the inventive principles. The techniques of the present invention can be implemented in any interconnect that uses a dynamic driver approach. The techniques are particularly advantageous in interconnects that utilize domino logic. Interconnects implementing the inventive principles can be used in all types of digital processing devices including, for example, general purpose microprocessors, digital signal processors (DSP), reduced instruction set computers (RISC), complex instruction set computers (CISC), digital field programmable gate arrays (FPGA), application specific integrated circuits (ASICs), and others.

Figure 1:
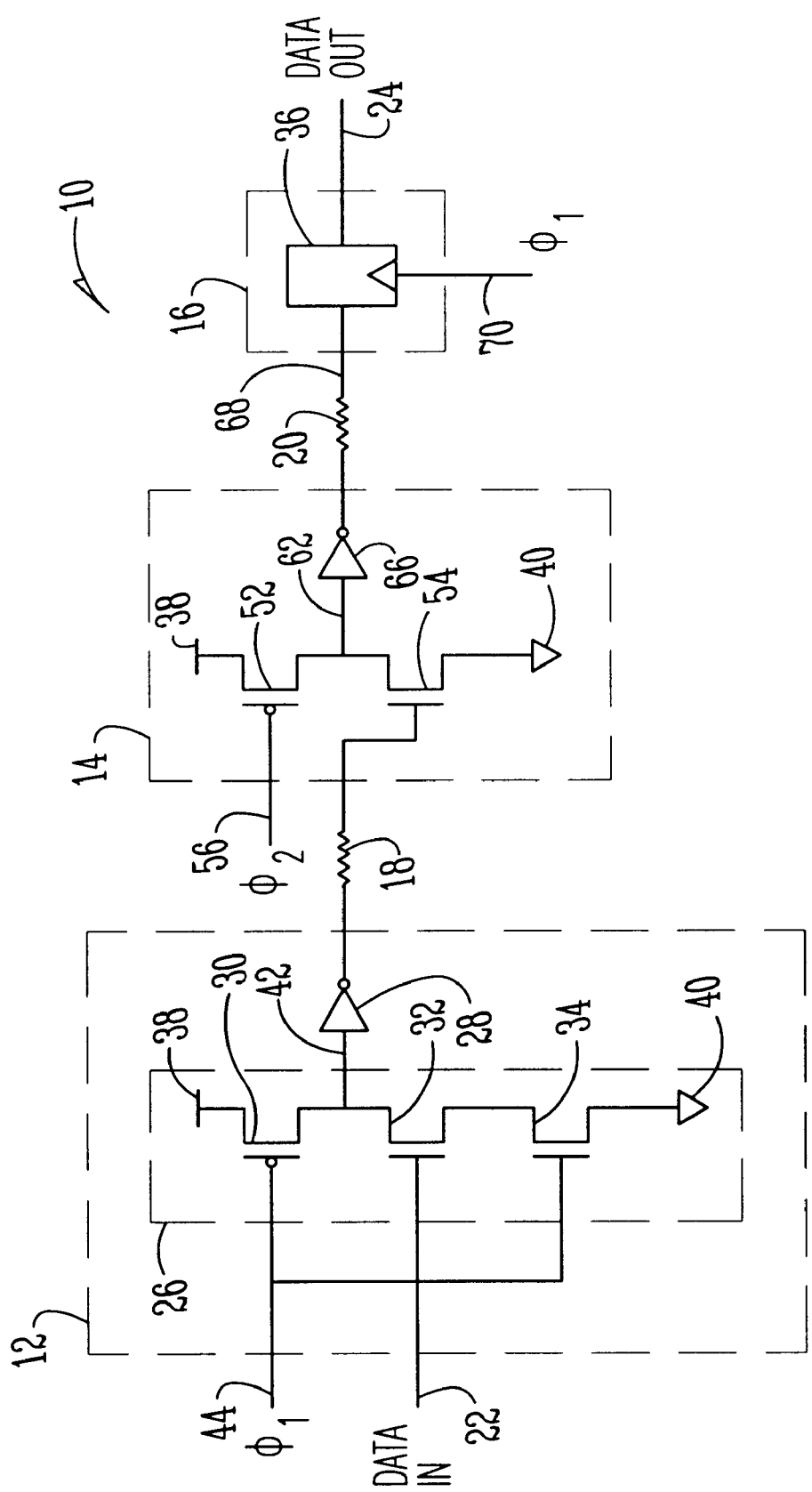
FIG. 1 is a schematic diagram illustrating a conventional domino logic-based interconnect that can be used to provide data communication between or within functional unit blocks (FUB) within a digital processor.

FIG. 1 is a schematic diagram illustrating a conventional domino logic-based interconnect 10 that can be used to provide data communication between or within functional unit blocks (FUB) within a digital processor. As illustrated, the interconnect 10 includes: a domino driver 12, a domino repeater 14, a receiver 16, and transmission media 18, 20. The interconnect 10 receives input data at an input terminal 22 from a first functional element within the digital processor and transfers the data to an output terminal 24 where it is made available to another functional element within the processor. The domino driver 12 receives the input data from the input terminal 22 and amplifies the data for transmission to the output terminal 24. The repeater 14 provides supplemental amplification at an intermediate point along the transmission path between the input 22 and the output 24. The number of repeaters 14 that are used will normally depend upon the length of the transmission path and the loss characteristics of the transmission media 18, 20. For a relatively short path, a repeater 14 may not be necessary, in which case the first transmission medium 18 will extend all the way to the receiver 16. The transmission media 18, 20 can include any of a number of different transmission structures that are capable of carrying digital data. For example, the transmission media 18, 20 can include on-chip or off-chip busses/interconnects, microstriplines, or co-planar waveguide structures. The receiver 16 can include any device that is capable of receiving and temporarily holding digital data bits in a sequential manner. In the illustrated embodiment, a master-slave flip flop 36 is used for data reception.

With reference to FIG. 1, the domino driver 12 includes a dynamic gate arrangement 26 that is coupled to an inverter 28 at an output thereof. The dynamic gate 26 includes a plurality of transistors that collectively perform the characteristic precharge and evaluate functions of the driver 12. The inverter 28 then inverts the output signal of the dynamic gate 26 and delivers the result to the transmission medium 18. As illustrated, the dynamic gate 26 includes a p-channel metal oxide semiconductor (PMOS) transistor 30 and two n-channel metal oxide semiconductor (NMOS) transistors 32, 34 in a series connection between supply 38 and ground 40. The PMOS transistor 30 is coupled between the supply 38 and the output terminal 42 of the dynamic gate 26. The two NMOS transistors 32, 34 form a series connection between the output terminal 42 and ground 40. The gates of the PMOS transistor 30 and the lower NMOS transistor 34 are each coupled to an input clock terminal 44 that carries a clock signal $\Phi_1$.

Figures 3, 4:
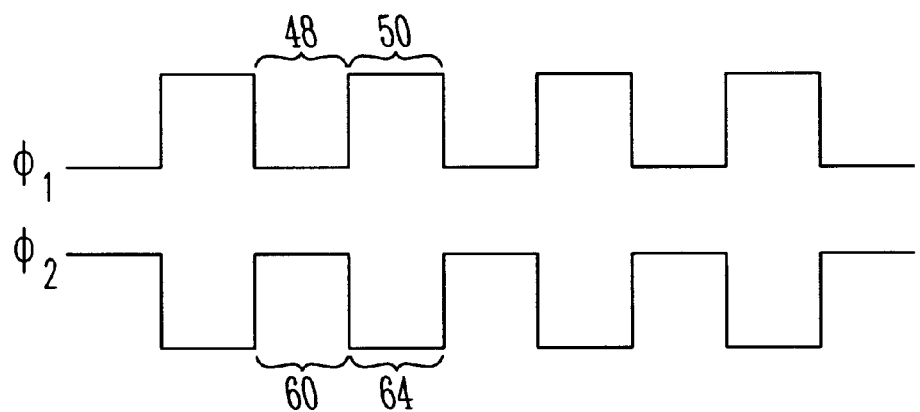
FIG. 3 is a truth table illustrating the operating characteristics of an exclusive OR gate within the interconnect of FIG. 2.
FIG. 4 is timing diagram illustrating two complementary clock signals used in the circuitry of FIG. 2.

As shown in FIG. 4, the clock signal $\Phi_1$ is a square wave having a duty cycle of approximately 50% in the illustrated embodiment. During a "low" portion 48 of the input clock signal $\Phi_1$, the PMOS transistor 30 is turned on and the supply 38 is allowed to precharge the output terminal 42 of the dynamic gate 26. The lower NMOS transistor 34 is turned off during this period, thus preventing any current flow through either NMOS transistor 32, 34. During this "low" portion 48 of the clock signal $\Phi_1$, a new input data bit is typically received at the input 22 of the interconnect 10, which is coupled to the gate of the upper NMOS transistor 32. However, because no current can flow through the upper NMOS transistor 32, the input data bit is ignored during the "low" portion 48 of the clock signal $\Phi_1$. When the "high" portion 50 of the clock signal $\Phi_1$ subsequently occurs, the PMOS transistor 30 is turned off and the lower NMOS transistor 34 is turned on. Depending on the value of the input data bit on the gate of the upper NMOS transistor 32, current may now be able to flow through the two NMOS transistors 32, 34. If the input data bit is logic high, the upper NMOS transistor 32 is "on" and the output terminal 42 is discharged to ground 40. This is known as an "evaluation" operation. If the input data bit is logic low, the upper NMOS transistor 32 is "off," and the output terminal 42 retains its charge. When the output terminal 42 is fully charged, the output of the inverter 28 is logic low. When the output terminal 28 is discharged, the output of the inverter 28 is logic high. Thus, the output node of the inverter 28 will be initially discharged and will subsequently charge up if an evaluation occurs. It should be appreciated that alternative dynamic driver architectures exist that pre-discharge the output terminal 42 of the dynamic gate 26 and thus precharge the output of the inverter 28. During a subsequent evaluation, therefore, the output terminal 42 is charged and the output of the inverter 28 is discharged.

The output data of the dynamic driver 12 is delivered to the transmission medium 18 which transfers the data to the domino repeater 14. As illustrated, the repeater 14 includes a PMOS transistor 52 and an NMOS transistor 54 in a series connection between supply 38 and ground 40. The gate of the NMOS transistor 54 is coupled to the output of the transmission medium 18. The gate of the PMOS transistor 52 is coupled to an input clock terminal 56 that carries a clock signal $\Phi_2$. As shown in FIG. 4, the $\Phi_2$ clock signal is, like the $\Phi_1$ clock signal, a square wave having a duty cycle of approximately 50% in the illustrated embodiment. However, the $\Phi_2$ signal is the complement of the $\Phi_1$ signal. Thus, when the output terminal 42 of the dynamic gate 26 within the domino driver 12 is charging during the "low" portion 48 of the clock $\Phi_1$, the "high" portion 60 of the clock $\Phi_2$ turns off the PMOS transistor 52 of the domino repeater 14, thus preventing any current flow through either the PMOS transistor 52 or the NMOS transistor 54. When the "low" portion 64 of the clock $\Phi_2$ subsequently occurs, the PMOS transistor 52 is turned on. If the data bit on the gate of the NMOS transistor 54 is logic high, the NMOS transistor 54 will conduct and the output terminal 62 will assume a logic low state. If the data bit on the gate of the NMOS transistor 54 is logic low, the NMOS transistor 54 will be "off" and the output terminal 62 will assume the full supply voltage. The inverter 66 will then invert the signal on the output terminal 62 and deliver the result to the transmission medium 20. The receiver 16 receives data from the transmission medium 20 at an input terminal 68 and the clock signal $\Phi_1$ at a clock terminal 70. For each pulse of the clock signal $\Phi_1$, the flip flop 36 within the receiver 16 latches a data bit presently at the input terminal 68 to the output terminal 24. The data bit is then delivered to the appropriate functional element within the digital processing device.

The precharging and discharging of the output terminal 42 of the dynamic gate 26 within the domino driver 12 is the main source of power loss within the driver 12. Thus, the interconnect 10 of FIG. 1 can consume a great deal of power during periods of low data switching activity. For example, if a long stream of logic one bits is applied to the input terminal 22 of the domino driver 12, the driver 12 needs to precharge and then discharge the output terminal 42 for each input bit within the data stream (i.e., during each clock cycle). In data busses within digital data processing devices, however, periods of low data switching activity are common. In conceiving of the present invention, it was appreciated that overall power consumption within a dynamic driver circuit could be reduced considerably by reducing the number of times that a precharge/discharge operation is performed during interconnect operation.

Figure 2:
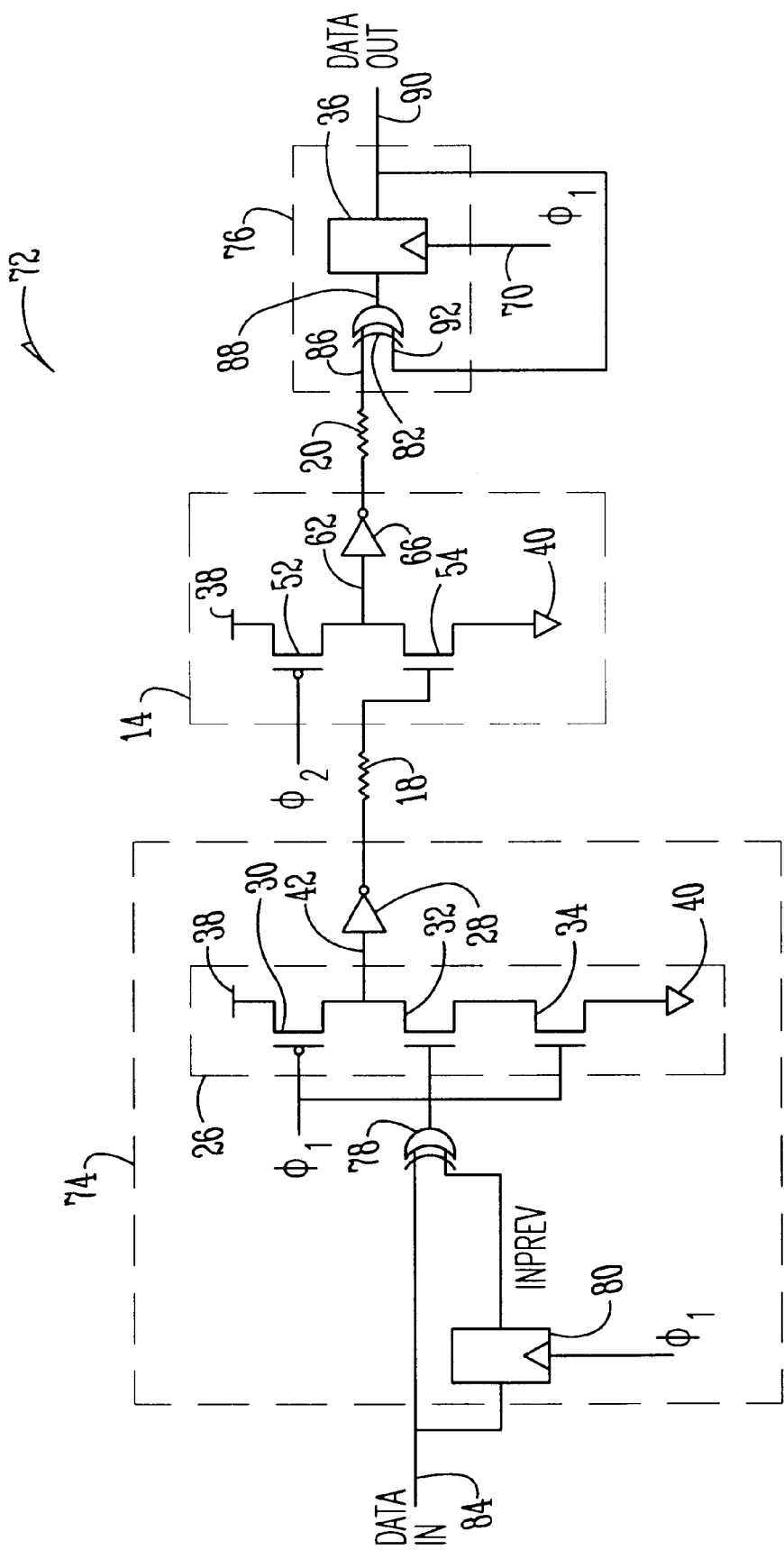
FIG. 2 is a schematic diagram illustrating a modified domino logic-based interconnect in accordance with one embodiment of the present invention.

FIG. 2 is a schematic diagram illustrating a modified domino logic-based interconnect 72 in accordance with one embodiment of the present invention. For purposes of convenience, the same reference numerals are used in FIG. 2 that were used in FIG. 1 to identify the same or similar functionality. As before, the interconnect 72 includes a domino driver 74, a domino repeater 14, and a receiver 76. However, the driver 74 has been modified to reduce the number of precharge/discharge operations that are performed within the domino driver 74 during periods of low data switching activity. In addition, the receiver 76 has been modified to compensate for changes made in the driver 74. As illustrated, an exclusive OR gate 78 and a master-slave flip flop 80 have been added to the driver circuitry 74. In addition, an exclusive OR gate 82 has been added to the receiver circuitry 76. The input flip flop 80 is coupled to the input terminal 84 of the interconnect 72 for receiving the input data stream. The input flip flop 80 is clocked using the first clock signal $\Phi_1$ and thus latches a present input bit to an output thereof during each clock cycle. The output of the flip flop 80 is therefore the data bit previously received at the input terminal 84 (i.e., Inprev). The exclusive OR gate 78 receives the present input bit at a first input terminal and the Inprev bit at a second input terminal and performs an exclusive OR operation using the two bit values. Thus, the output of the exclusive OR gate 78 will be logic high only when the two most recent input bit values are different from one another. FIG. 3 is a truth table illustrating the operating characteristics of the exclusive OR gate 78.

As shown in FIG. 2, the output of the exclusive OR gate 78 is coupled to the gate terminal of the upper NMOS transistor 32. As described previously, during the high portion 50 of clock signal $\Phi_1$, the output terminal 42 of the gate 26 will be discharged (i.e., evaluated) whenever the signal at the gate of the upper NMOS transistor 32 is logic high. In this manner, the domino driver 74 will only evaluate when the present input bit at the input terminal 84 is different from the previous input bit. Thus, during periods of low data switching activity (e.g., a long series of logic high bits or a long series of logic low bits), the domino driver 74 will remain charged and power consumption will be relatively low.

With reference to FIG. 2, the input flip flop 80 is preferably located off the critical transmission path, where it can be implemented using minimally sized devices. In addition, other alternative structures can be used for performing the functions of the flip flop 80 in accordance with the present invention. For example, the flip flop 80 can be replaced by virtually any form of digital memory device that is capable of storing a previously received data bit. In another alternative approach, a passive delay element having a delay of one clock cycle can be used. Other structures are also possible. It should be appreciated that many alternative circuit structures also exist for providing the collective functionality of the exclusive OR gate 78 and the flip flop 80 of FIG. 2, as will be apparent to persons of ordinary skill in the art. That is, any circuit arrangement that is capable of detecting a value change between successive data bits in a data stream can be used in accordance with the present invention.

Within the receiver 76, a similar scheme is used to restore the original input stream. The exclusive OR gate 82 is connected so that one of its input terminals 86 receives the data signal from the transmission medium 20 and its output terminal 88 is coupled to the input of the flip flop 36. The output of the flip flop 36 is coupled to the output terminal 90 of the interconnect 72 and is also fed back to the other input 92 of the exclusive OR gate 82. In this manner, a present output bit of the interconnect 72 is exclusive OR'ed with the bit presently being received from the transmission medium 20, for each cycle of clock signal $\Phi_1$, to generate the input bit of the flip flop 36. During each clock cycle, the input bit of the flip flop 36 is latched to the output 90 of the interconnect 72 and is thereafter exclusive OR'ed with the bit then being received from the transmission medium 20, and the process repeats. Using this approach, the output data stream of the flip flop 16 will replicate the data stream originally input into the interconnect 72.

Using the principles of the present invention, it is possible to achieve the performance advantages of dynamic drivers while generating the switching activity of interconnects that use static CMOS technology. Thus, improvements in both power consumption and performance can be achieved simultaneously. In an alternative approach, the size of the dynamic drivers can be reduced considerably to translate the performance improvement into further dynamic power savings. This will also reduce peak drive current and the accompanying decoupling capacitance requirement and also reduce the active driver layout area compared to prior art static CMOS approaches.

Although the present invention has been described in conjunction with certain embodiments, it is to be understood that modifications and variations may be resorted to without departing from the spirit and scope of the invention as those skilled in the art readily understand. For example, it is well known that equivalent semiconductor structures can generally be achieved by reversing the doping profiles of the elements (e.g., n doping changes to p doping, and vice versa). It is also well known that many equivalent circuit architectures exist for performing the various functions described herein. Such modifications and variations are considered to be within the purview and scope of the invention and the appended claims.

What is claimed is:

1. A dynamic driver circuit, comprising:

an input terminal to receive digital input data from a data source, said digital input data comprising data bits having either a first value or a second value;

logic circuitry, coupled to said input terminal, to generate a first indication when two successive data bits within said digital input data have different values and a second indication when two successive data bits within said digital input data have the same value; and a dynamic gate having a first transistor to precharge a first node within said dynamic driver circuit and a second transistor to subsequently discharge said first node when said logic circuitry generates said first indication, said first node remaining charged when said logic circuitry generates said second indication.

2. The dynamic driver circuit claimed in claim 1, wherein:

said logic circuitry includes a data storage device coupled to said input terminal of said dynamic driver circuit, said data storage device to store a previously received input data bit at an output thereof.

3. The dynamic driver circuit claimed in claim 2, wherein:

said data storage device includes a flip flop.

4. The dynamic driver circuit claimed in claim 2, wherein:

said logic circuitry includes an exclusive OR gate having first and second inputs, said first input being coupled to said input terminal of said dynamic driver circuit and said second input being coupled to said output of said data storage device.

5. The dynamic driver circuit claimed in claim 1, comprising:

an inverter coupled to an output of said dynamic gate, said first node being located at an input of said inverter.

6. The dynamic driver circuit claimed in claim 1, comprising:

an inverter coupled to an output of said dynamic gate, said first node being located at an output of said inverter.

7. The dynamic driver circuit claimed in claim 1, wherein:

said dynamic gate includes a third transistor, wherein said first, second, and third transistors are connected in series between a supply terminal and a ground terminal, said first transistor being directly coupled to said supply terminal and said third transistor being directly coupled to said ground terminal.

8. A dynamic driver circuit comprising:

an input terminal to receive digital input data from a data source, said digital input data comprising data bits having either a first value or a second value;

means for precharging a node within said dynamic driver circuit in response to a first portion of an input clock signal; and means for discharging said node in response to a second portion of said input clock signal when two successive data bits within said digital input data have different bit values.

9. The dynamic driver circuit claimed in claim 8, wherein:

said means for precharging includes a transistor having a first terminal coupled to said output terminal, a second terminal coupled to a supply terminal, and a third terminal coupled to a clock terminal to receive said input clock signal.

10. The dynamic driver circuit claimed in claim 8, wherein:

said means for discharging includes at least one transistor, a logic gate, and a data storage device, said data storage device to store a data bit previously received at said input terminal and said logic gate to perform a logic operation using said previously received data bit and a present data bit at said input terminal, said at least one transistor coupling said node to ground when an output of said logic gate has a predetermined value.

11. The dynamic driver circuit claimed in claim 10, wherein:

said logic gate includes an exclusive OR gate to perform an exclusive OR operation.

12. The dynamic driver circuit claimed in claim 8, wherein:

said input clock signal alternates between a first voltage value and a second voltage value, wherein said first portion of said input clock signal is a portion having said first voltage value and said second portion of said input clock signal is a portion having said second voltage value.

13. An interconnect to provide data communication between functional elements within a digital data processing device, said interconnect comprising:

a data input terminal to receive a digital data stream from a data source;

a data output terminal to deliver said digital data stream to a data destination;

at least one data transmission medium located between said data input terminal and said data output terminal to facilitate communication therebetween;

a dynamic driver circuit, coupled between said data input terminal and said at least one data transmission medium, to transmit a data signal on said at least one data transmission medium in response to said digital data stream at said data input terminal, said dynamic driver circuit including:

logic circuitry, coupled to said data input terminal, to generate a first indication when two successive data bits within said digital data stream have different values and a second indication when two successive data bits within said digital data stream have the same value; and a dynamic gate having a first transistor to precharge a first node within said dynamic driver circuit and a second transistor to subsequently discharge said first node when said logic circuitry generates said first indication, said first node remaining charged when said logic circuitry generates said second indication; and a receiver circuit, coupled between said at least one data transmission medium and said data output terminal, to receive said data signal from said at least one data transmission medium and decode said data signal to recover said digital data stream.

14. The interconnect claimed in claim 13, wherein:

said dynamic driver circuit includes an inverter having an output that is coupled to said at least one data transmission medium, said first node being located at an input of said inverter.

15. The interconnect claimed in claim 13, wherein:

said dynamic driver circuit includes an inverter having an output that is coupled to said at least one data transmission medium, said first node being located at an output of said inverter.

16. The interconnect claimed in claim 13, wherein:

said receiver circuit includes a logic gate and a data storage device, said logic gate having first and second input terminals and an output terminal and said data storage device having an input terminal and an output terminal, said output terminal of said logic gate being coupled to said input terminal of said data storage device, said first input terminal of said logic gate being coupled to said at least one transmission medium and said second input terminal of said logic gate being coupled to the output terminal of said data storage device, said output terminal of said data storage device also being coupled to said data output terminal of said interconnect, wherein said data storage device stores a data bit that was previously received at the input terminal of the data storage device at the output terminal thereof.

17. The interconnect claimed in claim 16, wherein:

said logic gate includes and exclusive OR gate and said data storage device includes a flip flop.

18. A digital data processing device comprising:

a first functional element to perform a first data processing function;

a second functional element to perform a second data processing function; and an interconnect connected between said first functional element and said second functional element to provide data communication therebetween, said interconnect including:

an input terminal to receive a digital data stream from said first functional element;

an output terminal to deliver said digital data stream to said second functional element; and a dynamic driver circuit, coupled to said input terminal, to generate an output bit having a first bit value when two consecutive input bits in said digital data stream have the same value and an output bit having a second bit value when two consecutive input bits within said digital data stream have different values.

19. The digital data processing device claimed in claim 18, wherein:

said dynamic driver circuit includes a first transistor to precharge a first node within said dynamic driver circuit and at least one second transistor to discharge said first node when a current input bit is different from a previous input bit.

20. The digital data processing device claimed in claim 19, wherein:

said first transistor precharges said first node in response to an input clock signal.

21. The digital data processing device claimed in claim 18, wherein said interconnect includes:

at least one data transmission medium to facilitate data communication between said input and output terminals of said interconnect; and a receiver coupled to said at least one data transmission medium to receive and decode an output signal of said dynamic driver circuit to recover said digital data stream.

* * * * *

UNITED STATES PATENT AND TRADEMARK OFFICE
CERTIFICATE OF CORRECTION

PATENT NO.   : 6,351,150 B1
DATED        : February 26, 2002
INVENTOR(S)  : Krishnamurthy et al.

It is certified that error appears in the above-identified patent and that said Letters Patent is hereby corrected as shown below:

<u>Column 6,</u>
Lines 7-9, delete the text and formatting from "source, said digital
          input data comprising data bits having either a first value
          or a second value;" and insert without linebreaks,
-- source, said digital input data comprising data bits having either a first value or a second value; --, therefor.

Signed and Sealed this

Tenth Day of August, 2004

JON W. DUDAS
*Acting Director of the United States Patent and Trademark Office*